(12) United States Patent
Tas et al.

(10) Patent No.: US 11,668,601 B2
(45) Date of Patent: Jun. 6, 2023

(54) INSTRUMENTED SUBSTRATE APPARATUS

(71) Applicant: KLA Corporation, Milpitas, CA (US)

(72) Inventors: Robert D. Tas, Aromas, CA (US); Earl Jensen, Santa Clara, CA (US)

(73) Assignee: KLA Corporation, Milpitas, CA (US)

(*) Notice: Subject to any disclaimer, the term of this patent is extended or adjusted under 35 U.S.C. 154(b) by 15 days.

(21) Appl. No.: 17/170,361

(22) Filed: Feb. 8, 2021

(65) Prior Publication Data
US 2021/0262859 A1 Aug. 26, 2021

Related U.S. Application Data

(60) Provisional application No. 62/980,764, filed on Feb. 24, 2020.

(51) Int. Cl.
*G01J 3/28* (2006.01)
*H01L 21/67* (2006.01)

(52) U.S. Cl.
CPC .......... *G01J 3/28* (2013.01); *H01L 21/67242* (2013.01)

(58) Field of Classification Search
CPC ........ G01J 3/28; G01J 1/429; H01L 21/67242
See application file for complete search history.

(56) References Cited

U.S. PATENT DOCUMENTS

| | | | |
|---|---|---|---|
| 5,569,916 A * | 10/1996 | Tomie | G01N 23/2273 378/43 |
| 7,135,852 B2 | 11/2006 | Renken et al. | |
| 7,555,948 B2 | 7/2009 | Wiese et al. | |
| 9,134,186 B2 | 9/2015 | Sun et al. | |
| 9,304,160 B1 | 4/2016 | Jensen et al. | |
| 9,305,753 B2 | 4/2016 | Jensen et al. | |
| 9,356,822 B2 | 5/2016 | Jensen | |
| 9,719,867 B2 | 8/2017 | Sharratt et al. | |

(Continued)

FOREIGN PATENT DOCUMENTS

| | | |
|---|---|---|
| CN | 104501842 A | 4/2015 |
| JP | 2006029997 A | 2/2006 |

(Continued)

OTHER PUBLICATIONS

PCT International Search Report and Written Opinion for International Application No. PCT/US2021/018957 dated Jun. 15, 2021, 10 pages.

*Primary Examiner* — David P Porta
*Assistant Examiner* — Gisselle M Gutierrez
(74) *Attorney, Agent, or Firm* — Suiter Swantz pc llo

(57) ABSTRACT

An instrumented substrate apparatus is configured to measure wavelength-resolved radiation, such as extreme ultraviolet radiation. The instrumented substrate apparatus includes a substrate and photoelectric sensors on the substrate. The photoelectric sensors include a photoemissive material, a photoelectron collector, and a measurement circuit. The measurement circuit is electrically coupled to the photoemissive material and the photoelectron collector. The measurement circuit is configured to measure a current generated by the photoelectron collectors by a current meter. Such current is used to determine the wavelength-resolved EUV measurement information by a controller on the instrumented substrate apparatus, or by communicating the current to a factory automation system.

35 Claims, 7 Drawing Sheets

(56) References Cited

U.S. PATENT DOCUMENTS

| | | | |
|---|---|---|---|
| 9,964,440 B2 | 5/2018 | Jensen et al. | |
| 10,215,626 B2 | 2/2019 | Sun et al. | |
| 10,460,966 B2 | 10/2019 | Sun et al. | |
| 10,777,393 B2 | 9/2020 | Jensen et al. | |
| 10,921,240 B1* | 2/2021 | Yan | G01N 21/6454 |
| 10,959,318 B2* | 3/2021 | Khodykin | H05G 2/008 |
| 2011/0074341 A1 | 3/2011 | Jensen et al. | |
| 2013/0264481 A1* | 10/2013 | Chern | G01N 21/8806 |
| | | | 257/432 |
| 2013/0313423 A1* | 11/2013 | Umstadter | B08B 17/02 |
| | | | 250/282 |
| 2013/0313442 A1* | 11/2013 | Wang | G03F 1/86 |
| | | | 250/336.1 |
| 2014/0034816 A1* | 2/2014 | Chuang | H01L 27/14893 |
| | | | 250/216 |
| 2016/0025554 A1* | 1/2016 | Gerhard | G01J 1/0238 |
| | | | 250/372 |
| 2017/0219437 A1 | 8/2017 | Sun et al. | |
| 2019/0295874 A1 | 9/2019 | Bieli et al. | |

FOREIGN PATENT DOCUMENTS

| | | |
|---|---|---|
| WO | 2013036576 A1 | 3/2013 |
| WO | 2017019171 A1 | 2/2017 |

\* cited by examiner

INSTRUMENTED SUBSTRATE APPARATUS

CROSS-REFERENCE TO RELATED APPLICATION

The present application claims the benefit under 35 U.S.C. § 119(e) of U.S. Provisional Application Ser. No. 62/980,764, filed Feb. 24, 2020, which is incorporated herein by reference in its entirety.

TECHNICAL FIELD

The present invention generally relates to monitoring of wafers along a semiconductor process line, and, in particular, to measuring extreme ultraviolet light irradiance on an instrumented wafer.

BACKGROUND

As tolerances on process conditions in semiconductor device processing environments narrows, a demand for improved process monitoring systems increases. Uniformity of illumination radiation, and particularly ultraviolet (UV) and extreme ultraviolet (EUV), within a processing system is one such condition. Current methods detect photons that exceed the 1 eV band gap in silicon. In some cases, filtering is employed to suppress sensitivity in the broad wavelength response space. Current silicon-based detectors are indiscriminate with respect to photon energies exceeding the bandgap, and therefore do not provide wavelength-resolved EUV measurement information.

Therefore, it would be advantageous to provide a device that cures the shortcomings described above.

SUMMARY

An instrumented substrate apparatus is disclosed, in accordance with one or more illustrative embodiments of the present disclosure. In one illustrative embodiment, the instrumented substrate apparatus includes a substrate. In another illustrative embodiment, the instrumented substrate apparatus includes a plurality of photoelectric sensors disposed on the substrate. In another illustrative embodiment, each photoelectric sensor includes a photoemissive material, a photoelectron collector, and one or more measurement circuits. In another illustrative embodiment, the photoemissive material is configured to absorb a plurality of photons and emit a plurality of photoelectrons in response absorbing the plurality of photons. In another illustrative embodiment, the photoelectron collector is configured to receive at least some of the plurality of photoelectrons and generate one or more electrical signals in response to receiving the at least some of the plurality of photoelectrons. In another illustrative embodiment, the one or more measurement circuits are electrically coupled to at least the photoelectron collector. In another illustrative embodiments, the one or more measurement circuits are configured to measure the one or more electrical signals from the photoelectron collector.

A method is disclosed, in accordance with one or more illustrative embodiments of the present disclosure. The method may include absorbing, with a photoemissive material, a plurality of photons within a process tool. The method may also include emitting, from the photoemissive material, a plurality of photoelectrons in response to absorbing the plurality of photons. The method may also include collecting at least some of the photoelectrons emitted from the photoemissive material. The method may also include generating one or more electrical signals in response to collecting the at least some of the photoelectrons. The method may also include measuring the one or more electrical signals. The method may also include determining wavelength-resolved information of illumination from the process tool based on the one or more electrical signals.

A method of fabricating an instrumented substrate apparatus configured to determine wavelength-resolved information of a process tool is disclosed, in accordance with one or more embodiments of the present disclosure. The method may include forming a substrate, the substrate including a silicon wafer with a diameter. The method may further include forming at least one sensor on the substrate by a microelectromechanical system (MEMS) fabrication, the at least one sensor including a photoemissive material, a photoelectron collector, and one or more measurement circuits.

BRIEF DESCRIPTION OF THE DRAWINGS

The numerous advantages of the disclosure may be better understood by those skilled in the art by reference to the accompanying figures.

DETAILED DESCRIPTION OF THE INVENTION

Figure 1:
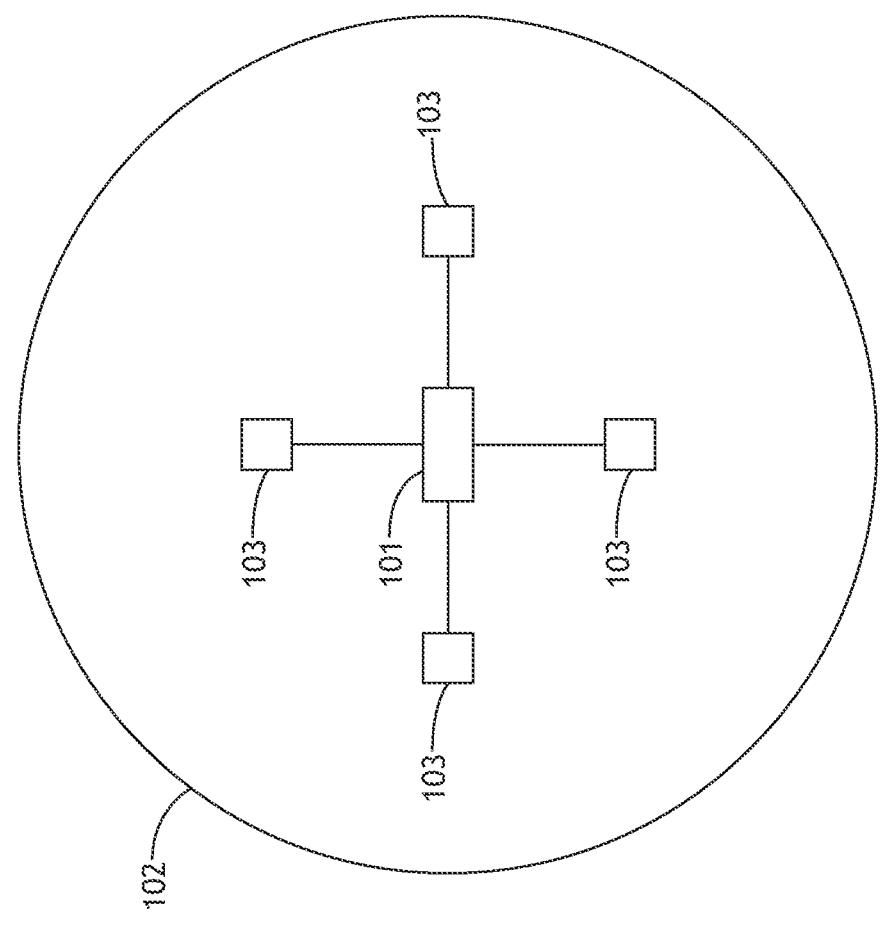
FIG. 1 depicts a top view of an instrumented substrate apparatus, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to an instrumented substrate apparatus suitable for performing wavelength-resolved measurements of radiation, such as extreme ultraviolet (EUV) radiation, via the photoelectric effect. The instrumented substrate apparatus may include a substrate and one or more photoelectric sensors disposed on the substrate. The one or more photoelectric sensors may include a photoemissive material, a photoelectron collector, and one or more measurement circuits. The one or more measurement circuits may be electrically coupled to the photoemissive material and/or the photoelectron collector. The one or more measurement circuits may be configured to measure an electrical signal, such as a current generated by the photoelectron collectors, to determine the wavelength-resolved information. The one or more measurement circuits may further include a voltage source. The instrumented substrate apparatus may be further configured to store the wavelength-resolved radiation in a memory for determining a time-resolved information. The instrumented substrate apparatus may include multiple photoelectric sensors for determining spatially-resolved EUV measurement information. The instrumented wafer apparatus is configured for compatibility with a factory automation system and/or a front opening unified pod (FOUP).

Devices, Systems, and Methods related to process management are generally described in U.S. Pat. No. 7,135,852 titled INTEGRATED PROCESS CONDITION SENSING WAFER AND DATA ANALYSIS SYSTEM and issued on Nov. 14, 2006; U.S. Pat. No. 7,555,948 titled PROCESS CONDITION MEASURING DEVICE WITH SHIELDING and issued on Jul. 7, 2009; U.S. Pat. No. 9,134,186 titled PROCESS CONDITION MEASURING DEVICE (PMCD) AND METHOD FOR MEASURING PROCESS CONDITIONS IN A WORKPIECE PROCESSING TOOL CONFIGURED TO PROCESS PRODUCTION WORKPIECES and issued on Sep. 15, 2015; U.S. Pat. No. 9,304,160 titled DEFECT INSPECTION APPARATUS, SYSTEM, AND METHOD and issued on Apr. 5, 2016; U.S. Pat. No. 9,305,753 titled THICKNESS CHANGE MONITOR WAVER FOR IN SITU FILM THICKNESS MONITORING and issued on Apr. 5, 2016; U.S. Pat. No. 9,356,822 titled AUTOMATED INTERFACE APPARATUS AND METHOD FOR USE IN SEMICONDUCTOR WAVER HANDLING SYSTEM and issued on May 31, 2016; U.S. Pat. No. 9,719,867 titled METHOD AND SYSTEM FOR MEASURING HEAT FLUX and issued on Aug. 1, 2017; U.S. Pat. No. 9,964,440 titled WAVER LEVEL SPECTROMETER and issued on May 8, 2018; U.S. Pat. No. 10,215,626 titled METHOD AND SYSTEM FOR MEASURING RADIATION AND TEMPERATURE EXPOSURE OF WAVERS ALONG A FABRICATION PROCESS LINE and issued on Feb. 26, 2019; U.S. Pat. No. 10,460,966 titled ENCAPSULATED INSTRUMENTED SUBSTRATE APPARATUS FOR ACQUIRING MEASUREMENT PARAMETERS IN HIGH TEMPERATURE PROCESS APPLICATIONS and issued on Oct. 29, 2019; U.S. Pat. No. 10,777,393 titled PROCESS CONDITION SENSING DEVICE AND METHOD FOR PLASMA CHAMBER and issued on Sep. 15, 2020; U.S. patent application Ser. No. 12/567,664 published as Publication No. 2011/0074341 titled NON-CONTACT INTERFACE SYSTEM and filed on Sep. 25, 2009; U.S. patent application Ser. No. 15/277,753 published as Publication No. 2017/0219437 titled INSTRUMENTED SUBSTRATE APPARATUS FOR ACQUIRING MEASUREMENT PARAMETERS IN HIGH TEMPERATURE PROCESS APPLICATIONS; U.S. patent application Ser. No. 16/280,145 published as Publication No. 2019/0295874 titled SAMPLE TRANSPORT DEVICE WITH INTEGRATED METROLOGY and filed on Feb. 20, 2019; all of which are incorporated herein by reference in their entirety.

Referring generally to FIGS. 1 to 4, an instrumented substrate apparatus 100, a system 300, and a method 400 are disclosed, in accordance with one or more embodiments of the present disclosure.

FIG. 1 depicts a top view of the instrumented substrate apparatus 100 for measuring EUV light conditions in a process chamber, in accordance with one or more embodiments of the present disclosure.

The instrumented substrate apparatus 100 may include a substrate 102. The substrate 102 may include any suitable material, such as, but not limited to, silicon. For example, the substrate 102 may be made of the same or similar materials to a production substrate. In particular, a doped (e.g., n-type or p-type) silicon substrate may be used. Furthermore, the substrate 102 may be of similar dimensions to a production wafer. In this regard, the substrate 102 may have a diameter from 25 mm to 450 mm, such as, but not limited to, 25 mm, 50 mm, 75 mm, 100 mm, 125 mm, 150 mm, 200 mm, 300 mm, or 450 mm.

The substrate 102 may include a top planar surface. One or more components of the instrumented substrate apparatus 100 may be attached to the top planar surface. For example, the instrumented substrate apparatus 100 may include a photoelectric sensor 103 disposed on the top planar surface of the substrate 102. The photoelectric sensor 103 may be configured to generate current in response to receiving illumination. The illumination may include a spectrum containing both in-band (e.g., a 13.5 nm EUV band) and out-of-band illumination. The photoelectric sensor 103 may generate current in response to receiving the illumination on the photoelectric sensor by the photoelectric effect. Such current may then be used to determine wavelength-resolved information of the illumination, as described further herein. The wavelength-resolved information may be indicative of the spectrum of the illumination at a point in time (e.g., the in-band and out-of-band wavelengths).

Figure 3:
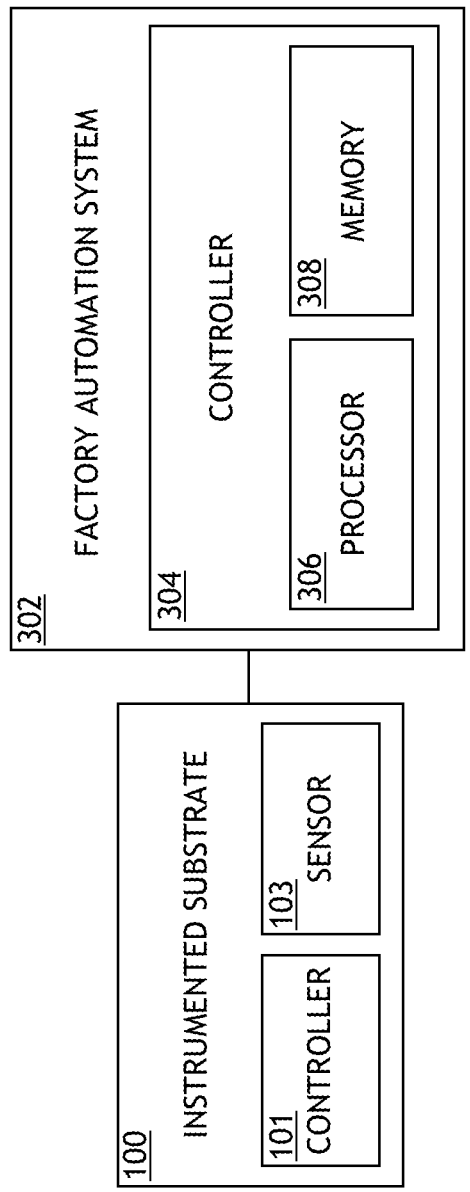
FIG. 3 depicts a conceptual view of a system for EUV irradiance measurements on an instrumented substrate within a process chamber, in accordance with one or more embodiments of the present disclosure.

In embodiments, the wavelength-resolved information may be stored in a memory (see FIG. 3, for example). The wavelength-resolved information may be indicative of a spectrum of the illumination at a point in time. By storing the wavelength-resolved information of the illumination in the memory, the system 100 may construct a data set including measurements acquired at a series of times. In embodiments, the time-resolved information may include a series of spectra, whereby each spectrum is acquired at (or across) a unique time.

In embodiments, the photoelectric sensors 103 may be disposed on the substrate 102. The photoelectric sensors 103 may be disposed at one or more locations on the substrate 102. It is noted that the arrangement and number of photoelectric sensors 103 depicted are not limiting and are provided merely for illustrated purposes. Rather, it is recognized that the photoelectric sensors 103 may be configured in a number of patterns, shapes and quantities.

The illumination impinging on the instrumented substrate apparatus 100 may include a spectrum which varies at various positions across the instrumented substrate apparatus 100. In embodiments, photoelectric sensors 103 may be disposed at multiple locations on the substrate 102, for generating a current indicative of the spectrum of the illumination at each of the locations. Spatially-resolved EUV measurement information may be then be determined based on the generated current. For example, the spatially-resolved EUV measurement information may include wavelength-resolved information (e.g., the spectrum of the illumination) collected at the photoelectric sensor 103 locations. This may be advantageous, as such information may be collected without the need to adjust a position of the instrumented substrate apparatus 100. In embodiments, the spatially-resolved information may be stored in the memory for determining the time-resolved information (e.g., at each of the photoelectric sensor 103 locations).

In embodiments, in the case of a silicon substrate, the photoelectric sensors 103 may be formed on the substrate 102 via microelectromechanical system (MEMS) fabrication, such as, but not limited to, wet etching, dry etching, or electrical discharge machining.

In embodiments, the instrumented substrate apparatus 100 may include a controller 101. The photoelectric sensors 103 may be communicatively coupled with the controller 101. In this regard, the controller 101 may acquire one or more measurements from the photoelectric sensors 103. In another embodiment, the controller 101 is communicatively coupled with a factory automation system (see FIG. 3, factory automation system 302). The controller 101 may transmit the one or more measurements acquired from the photoelectric sensors 103 to the factory automation system.

The photoelectric sensors 103 may be communicatively coupled to the controller 101 via one or more wirelines. For example, the photoelectric sensors 103 may be communicatively coupled to the controller 101 via one or more copper wires. In embodiments, the wirelines coupling the controller with the sensors may be sealed (e.g., hermetically sealed).

FIGS. 2A-2D depict a cross-sectional view illustrating at least a portion of the instrumented substrate apparatus 100, in accordance with one or more embodiments.

In embodiments, a photoelectric sensor 103 includes a photoemissive material 104, a photoelectron collector 106, and a measurement circuit 108. The measurement circuit 108 may be electrically coupled to the photoelectron collector 106. In embodiments, the measurement circuit 108 may electrically couple the photoelectron collector 106 with the photoemissive material 104. The measurement circuit 108 may further include a voltage source 110 and a current meter 112.

Figure 2A:
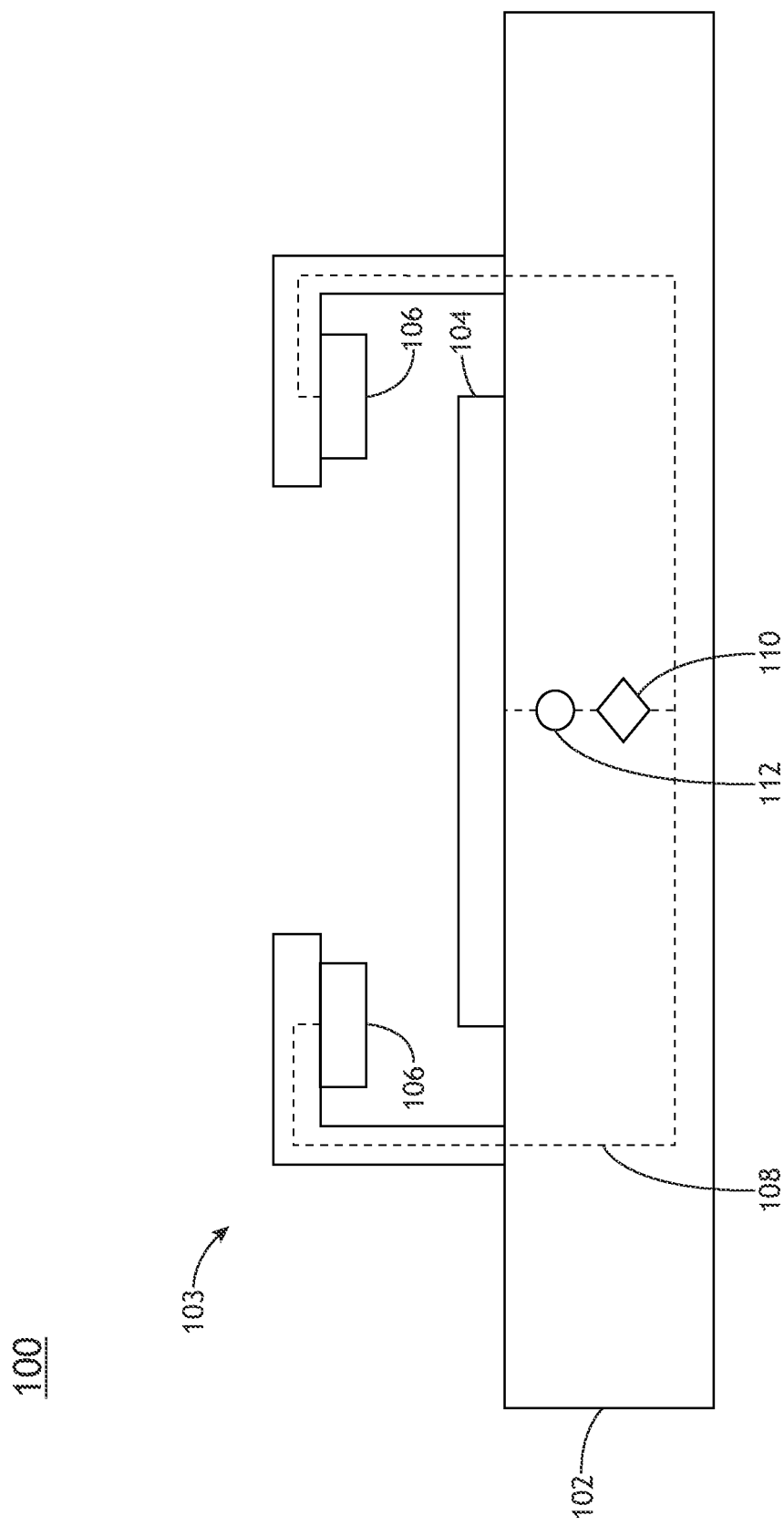
FIGS. 2A through 2D depicts a cross sectional view of the instrumented substrate apparatus, in accordance with one or more embodiments of the present disclosure.
Figure 2B:
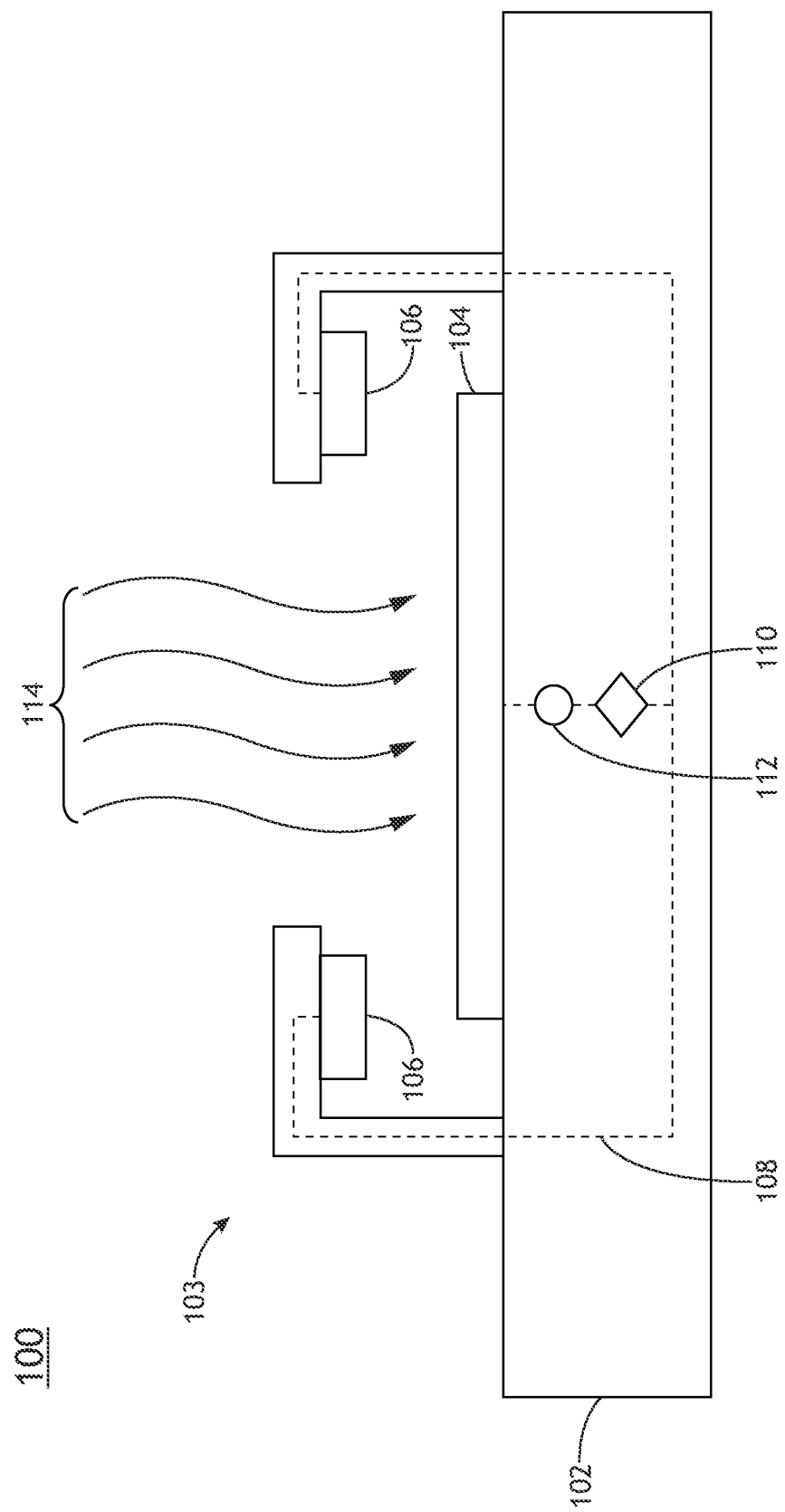

Referring now to FIG. 2B, a cross-sectional view illustrating at least a portion of the instrumented substrate apparatus 100 is depicted, in accordance with one or more embodiments of the present disclosure. Photons 114 may be generated by an illumination source (not depicted). The illumination source may be configured to direct the photons 114 to the photoelectron sensor 103 (e.g., via one or more illumination optics of the illumination source). The illumination source may include any suitable illumination source, such as, but not limited to, an extreme ultraviolet (EUV) illumination source. The extreme ultraviolet (EUV) illumination source may be configured to generate photons 114 with an energy in a range of 1 eV to 100 eV. For example, the illumination may include in-band radiation of approximately 13.5 nm as well as out-of-band illumination.

In embodiments, the photoemissive material 104 may be configured to absorb the photons 114. The photoemissive material 104 may include a conductor, a semiconductor, or a combination of a conductor and semiconductor material. The photoemissive material 104 may have a modified or coated surface. By way of example, the photoemissive material 104 may include, but is not limited to, gold, platinum, ruthenium, palladium, titanium, tantalum, tungsten, molybdenum, cobalt, zinc, tin, or gallium. For example, the photoemissive material 104 may be selected based on a work-function of the material. Furthermore, the photoemissive material 104 may include a metal with no- or self-terminating stable oxide formation.

Figure 2C:
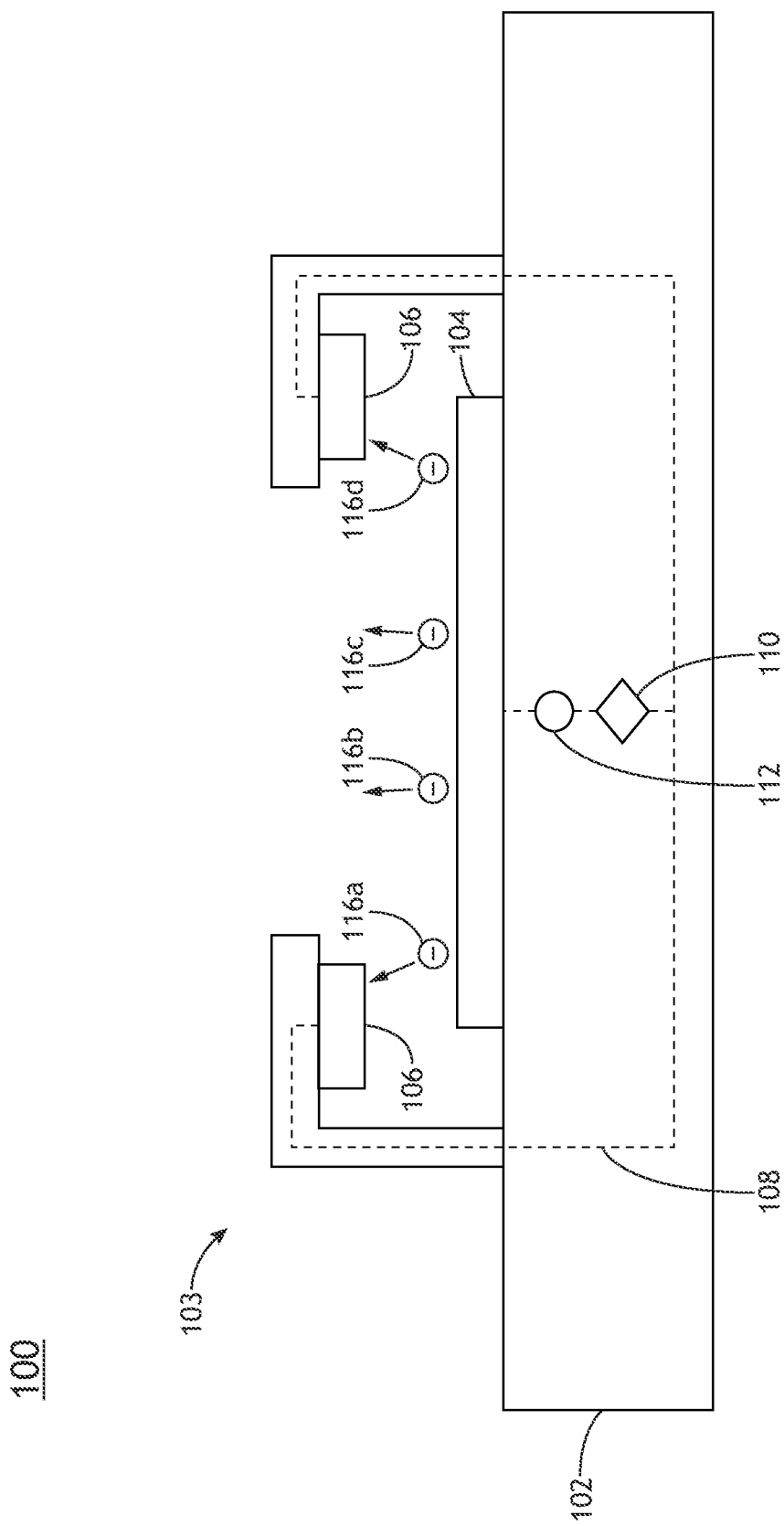

Referring now to FIG. 2C, a cross-sectional view illustrating a portion of the instrumented substrate apparatus 100 is depicted, in accordance with one or more embodiments of the present disclosure.

In embodiments, the photoemissive material 104 may be configured to emit photoelectrons 116. The photoelectrons 116 may be emitted by the photoemissive material 104 in response to absorbing the photons 114. For example, the photoelectrons 116 may be emitted when the photons 114 have an energy ($E_{photon}$), defined by $E_{photon}=h*f$, exceeding a work function (W) of the photoemissive material 104. When the photoelectron 116 is emitted from the photoemissive material 104, photoelectrons 116 may have a kinetic energy ($K_{max}$), which is equal to the energy of the photon ($E_{photon}$) minus the work function of the photoemissive material (W) (e.g., $K_{max}=E_{photon}-W$). In cases where the photons 114 have an energy less than or equal to the work function of the photoemissive material 104, no photoelectrons 116 will be emitted.

Figure 2D:
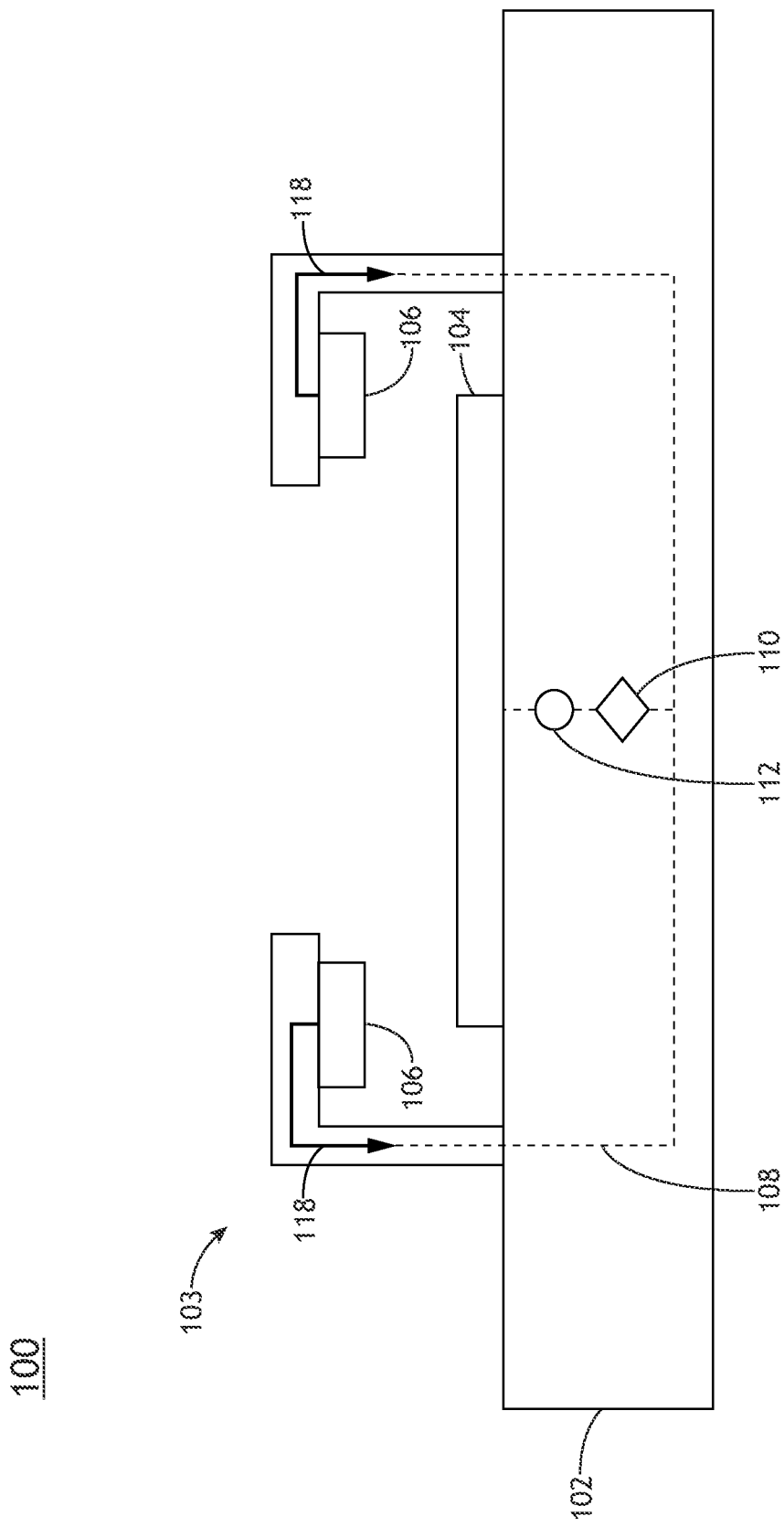

Referring now to FIG. 2D, a cross-sectional view illustrating a portion of the instrumented substrate apparatus 100 is depicted, in accordance with one or more embodiments of the present disclosure.

The photoelectron collector 106 may receive some of the photoelectrons 116 (e.g., photoelectron 116a and photoelectron 116d) emitted from the photoemissive material 104. For example, the photoelectron collector 106 may include, but is not limited to, a ring structure positioned above the photoemissive material 104. In this regard, the photoelectron collector 106 allows illumination to pass from the environment of the process chamber and onto the photoemissive material 104, but is positioned to capture electrons emitted from the photoemissive material 104. Furthermore, an area between the photoemissive material 104 and the photoelectron collector 106 may be evacuated to improve transmission of the photoelectrons 116 from the photoemissive material 104 to the photoelectron collector 106.

The photoelectron collector 106 may generate one or more electrical signals in response to receiving some of the photoelectrons 116. The one or more electrical signals may include current 118. The photoelectron collector 106 may include any suitable material configured to receive the photoelectrons 116 and generate current 118. For example, the photoelectron collector 106 may include, but is not limited to, gold or platinum.

In embodiments, the measurement circuit 108 may measure the electrical signals. For example, the measurement circuit 108 may measure the current 118 by a current meter 112. In this regard, the measurement circuit 108 may move the current 118 from the photoelectron collector 106 to the current meter 112. The current meter 112 may include any suitable sensor for measuring the current 118 generated by the photoelectron collector 106, such as, but not limited to, a shunt resistor or a hall effect sensor.

In embodiments, the photoemissive material 104 and the photoelectron collector 106 may include a difference in electric potential (e.g., a voltage difference). The difference in electric potential may be due, at least in part, to the voltage source 110. The voltage source 110 may include any suitable voltage source, such as, a battery (e.g., a capacitor) disposed on the substrate 102 or a connection to a factory automation system (see FIG. 3, factory automation system 302). In embodiments, the voltage source 110 is configurable between multiple voltages.

As the difference in electric potential between the photoelectron collector 106 and the photoemissive material 104 decreases (e.g., due to an increase in voltage by the voltage source 110), the photoelectron 116 may experience a higher repulsive force from the photoelectron collector 106. In this regard, when there is no current 118 measured, the photoelectron collector 106 has sufficient force to prevent the transmission of the photoelectrons 116 to the photoelectron collector 106. The amount of voltage required from the voltage source 110 to stop the transmission of the photoelectron 116 is a stopping voltage ($V_0$). The work done by preventing the transmission of the photoelectron 116 is equal to the charge of an electron (e) times the stopping voltage ($V_0$). This work is equal to the kinetic energy ($K_{max}$) of the photoelectron 116 as the photoelectron 116 is emitted from the photoemissive material 104 (e.g., $e*V_0=K_{max}$).

Thus, the frequency (and similarly wavelength) for the photons 114 may be determined by adjusting the potential difference (e.g., by the voltage source 110) between the photoelectron collector 106 and the photoemissive material 104 until no current 118 is measured (e.g., by substituting the above to solve for: $f=(e*V_0+W_0)/h$).

In embodiments, the photons 114 may include multiple wavelengths. For example, some of the photons 114 may be in a 13.5 nm EUV band and some of the of photons 114 may be outside of the 13.5 nm EUV band. As the potential difference between the photoelectron collector 106 and the photoemissive material 104 is adjusted, the current 118 generated by the photoelectron collector 106 may be similarly adjusted and measured. The current 118 may be stored as a function of the voltage from the voltage source 110. By taking a derivative of the measured current 118 with respect to the voltage from the voltage source 110, an irradiance of the illumination may be determined as a function of the voltage. The voltage may be calibrated to wavelength units by subtracting the work function and converting by way of Planck's equation. Thus, the instrumented substrate apparatus 100 may be used to determined wavelength-resolved EUV measurement information of the illumination source.

FIG. 3 depicts a system 300, in accordance with one or more embodiments of the present disclosure.

In embodiments, the system 300 includes the instrumented substrate apparatus 100 and a factory automation system 302. The factory automation system 302 may be communicatively coupled with the instrumented substrate apparatus 100. By the communicative coupling, the factory automation system 302 may control a voltage of the voltage source 110. The factory automation system 302 may also receive the one or more electrical signals by the communicative coupling (e.g., the current 118).

The factory automation system 302 may include a controller 304. The controller 304 (and similarly for the controller 101 of the instrumented substrate apparatus 100) may include one or more processors 306 and a memory 308. The processors 306 may execute any of the various process steps described throughout the present disclosure, such as, but not limited to, determining wavelength-resolved EUV measurement information, time-resolved information, and/or spatially-resolved EUV measurement information. For example, the memory 308 may be configured to store the measured electrical signals (e.g., the measured current 118) for determining the time-resolved information.

The one or more processors 306 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 306 may include any device configured to execute algorithms and/or instructions (e.g., program instructions stored in memory). In embodiments, the one or more processors 306 may be embodied as a desktop computer, mainframe computer system, workstation, image computer, parallel processor, networked computer, or any other computer system configured to execute a program configured to operate or operate in conjunction with the instrumented substrate apparatus 100, as described throughout the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 304 may include one or more controllers housed in a common housing or within multiple housings. In this way, any controller or combination of controllers may be separately packaged as a module suitable for integration into system 300. Further, the controller 304 may analyze data received from the instrumented substrate apparatus 100 and feed the data to additional components within the system 300 or external to the system 300.

The memory 308 may include any storage medium known in the art suitable for storing program instructions executable by the associated one or more processors 306. For example, the memory 308 may include a non-transitory memory. By way of another example, the memory 308 may include, but is not limited to, a read-only memory (ROM), a random-access memory (RAM), a magnetic or optical memory device (e.g., disk), a magnetic tape, a solid-state drive and the like. It is further noted that memory 308 may be housed in a common controller housing with the one or more processors 306. In embodiments, the memory 308 may be located remotely with respect to the physical location of the one or more processors 306 and controller 304. For instance, the one or more processors 306 of controller 304 may access a remote memory (e.g., server), accessible through a network (e.g., internet, intranet and the like).

In embodiments, the controller 101 of the instrumented substrate apparatus 100 is communicatively coupled to the factory automation system 302 by a wired communication. By the wired communication, the controller 101 may communication one or more values to the factory automation system 302. Furthermore, the factory automation system 302 may provide a voltage to the photoelectron collector 106 by the wired communication.

In embodiments, the controller 101 of the instrumented substrate apparatus 100 is communicatively coupled to the factory automation system 302 by a wireless communication. The controller 101 may be wirelessly communicatively coupled to the factory automation system 302 in any suitable manner. For example, the instrumented substrate apparatus 100 may include communication circuitry (not depicted). The communication circuitry may include any communication circuitry and/or communication device known in the art of communication. For instance, the communication circuitry may include, but is not limited to, one or more communication antennas (e.g., communication coil). In embodiments, the communication circuitry is configured to establish a communication link between the controller 101 and the factory automation system 302. By the communication link, one or more signals (e.g., measurement parameters) may be sent to the factory automation system 302. In embodiments, the factory automation system 302 includes communication circuitry suitable for establishing the communication link. For example, the communication link may include using a radio frequency (RF) signal. As discussed further herein, the values associated with the photoelectric sensor 103 measurements may be calculated by the controller 101 and/or the factory automation system 302. Where the controller 101 is wirelessly coupled with the factory automation system 302, the voltage source to the photoelectron collector 106 may be provided by a battery of the instrumented substrate apparatus 100.

In embodiments, the controller 101 calculates one or more values based on the measurement parameters acquired by the photoelectric sensors 103. For example, the controller 101 may calculate one or more of wavelength-resolved, time-resolved, or spatially-resolved EUV measurement information of the photons 114. In turn, the controller 101 may transmit the calculated values to the factory automation system 302.

In embodiments, the factory automation system 302 receives the measurement parameters from the controller 101 and calculates one or more values based on the measurement parameters acquired by the photoelectric sensors 103. In this regard, the controller 101 transmits the measurement parameters to the factory automation system 302. In turn, the factory automation system 302 may calculate one or more of wavelength-resolved, time-resolved, or spatially-resolved EUV measurement information of the photons 114.

In embodiments, the factory automation system 302 reports the one or more values to a user interface. For example, the factory automation system 302 may report wavelength-resolved, time-resolved, or spatially-resolved EUV measurement information of the photons 114 to a desktop computer, laptop, tablet, handheld device, memory or a server.

In embodiments, the instrumented substrate apparatus 100 may be configured to be housed within a front opening unified pod (FOUP) (not depicted). The FOUP may include a standard substrate carrier which is configured to be integrated with the factory automation system 302. The FOUP may provide an environment for storing and transporting the instrumented substrate apparatus 100. Additionally, the factory automation system 302 may be configured to remove the instrumented substrate apparatus 100 from the FOUP and place the instrumented substrate apparatus 100 within a pathway of the photons 114.

Figure 4:
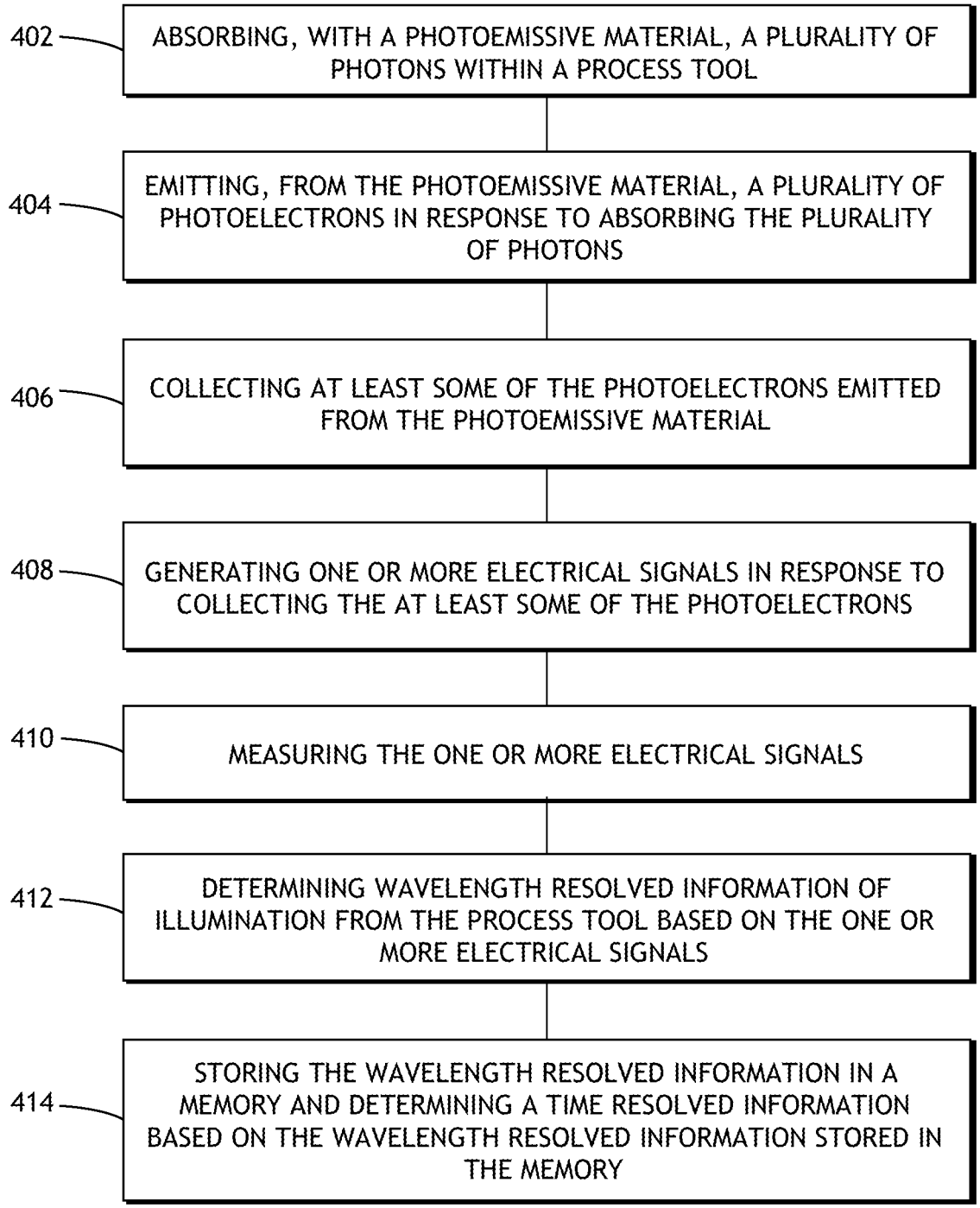
FIG. 4 depicts a diagram of a method of measuring EUV irradiance within a process chamber, in accordance with one or more embodiments of the present disclosure.

FIG. 4 depicts a method 400, in accordance with one or more embodiments of the present disclosure. The embodiments and the enabling technologies described previously herein in the context of instrumented substrate apparatus 100 and system 300 should be interpreted to extend to the method 400. It is further recognized, however, that the method 400 is not limited to the instrumented substrate apparatus 100 and the system 300.

In step 402, the method 400 absorbs, with a photoemissive material, photons within a process tool. The photons may be in the EUV spectral range with an energy between 1 and 100 eV. For example, the spectral range may include in-band radiation in a 13.5 nm band and out-of-band radiation.

In step 404, the method 400 emits, from the photoemissive material, photoelectrons in response to absorbing the photons.

In step 406, the method 400 collects at least some of the photoelectrons emitted from the photoemissive material. At least some of the photoelectrons emitted from the photoemissive material may be collected by a photoelectron collector.

In step 408, the method 400 generates one or more electrical signals in response to collecting the at least some of the photoelectrons. The one or more electrical signals may be generated in response to collecting the at least some of the photoelectrons by the photoelectron collector collecting the at least some of the electrons. The one or more electrical signals may include a current.

In step 410, the method 400 measures the one or more electrical signals. The one or more electrical signals may be measured by a current meter, such as, but not limited to, a shunt resistor or a hall effect sensor In step 412, the method 400 determines wavelength-resolved EUV measurement information of illumination from the process tool based on the one or more electrical signals. Determining the wavelength-resolved EUV measurement information may include taking a derivative of the current with respect to a voltage of a voltage source. The voltage source may be electrically coupled with at least the photoelectron collector, for adjusting a stopping voltage of the photoelectron collector. In embodiments, spatially-resolved EUV measurement information may be determined.

In step 414, the method 400 stores the wavelength-resolved EUV measurement information in a memory and determines time-resolved information based on the wavelength-resolved EUV measurement information stored in the memory.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "front," "back," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. An instrumented substrate apparatus, comprising:
    a substrate;
    a plurality of photoelectric sensors disposed on the substrate, each photoelectric sensor comprising:
        a photoemissive material, the photoemissive material configured to absorb a plurality of photons and emit a plurality of photoelectrons in response absorbing the plurality of photons;
        a photoelectron collector, wherein the photoelectron collector is configured to receive at least some of the plurality of photoelectrons and generate one or more electrical signals in response to receiving the at least some of the plurality of photoelectrons; and
        one or more measurement circuits electrically coupled to at least the photoelectron collector and configured to measure the one or more electrical signals from the photoelectron collector, wherein the instrumented substrate apparatus is configured for housing within a front opening unified pod (FOUP).

2. The instrumented substrate apparatus of claim 1, wherein the photoemissive material and the photoelectron collector have a difference in electric potential.

3. The instrumented substrate apparatus of claim 2, wherein the photoemissive material is configured to emit the plurality of photoelectrons in response to absorbing the photons when an energy of the plurality of photons absorbed by the photoemissive material exceeds a work function of the photoemissive material plus a stopping voltage.

4. The instrumented substrate apparatus of claim 1, further comprising:
    a controller disposed on the substrate, the controller configured to receive measurement information from the one or more measurement circuits, wherein the controller includes one or more processors configured to execute a set of program instructions stored in memory.

5. The instrumented substrate apparatus of claim 4, wherein the one or more processors are configured to determine wavelength-resolved extreme ultraviolet (EUV) measurement information associated with the plurality of photons based on the one or more electrical signals from the one or more measurement circuits.

6. The instrumented substrate apparatus of claim 5, wherein the one or more processors are configured to determine the wavelength-resolved EUV measurement information based on a derivative of current with respect to voltage.

7. The instrumented substrate apparatus of claim 5, wherein the one or more processors are configured to determine spatially-resolved EUV measurement information based on the wavelength-resolved EUV measurement information from the plurality of photoelectric sensors.

8. The instrumented substrate apparatus of claim 5, wherein the one or more processors are configured to store the wavelength-resolved EUV measurement information in a memory of the controller.

9. The instrumented substrate apparatus of claim 8, wherein the one or more processors are configured to determine a time-resolved EUV measurement information based on the wavelength-resolved EUV measurement information stored in the memory.

10. The instrumented substrate apparatus of claim 1, wherein the FOUP is configured for operation within a factory automation system.

11. The instrumented substrate apparatus of claim 10, wherein the factory automation system is communicatively coupled to the instrumented substrate apparatus for receiving the one or more electrical signals and configuring the difference in electric potential.

12. The instrumented substrate apparatus of claim 11, wherein the difference in electric potential is provided by at least one of a battery disposed on the substrate or by the communicative coupling with the factory automation system.

13. The instrumented substrate apparatus of claim 1, wherein the plurality of photons have an energy from 1 eV to 100 eV.

14. The instrumented substrate apparatus of claim 1, wherein the photoemissive material is at least one of gold, platinum, ruthenium, palladium, titanium, tantalum, tungsten, molybdenum, cobalt, zinc, tin, or gallium.

15. The instrumented substrate apparatus of claim 1, wherein the photoemissive material and the photoelectron are integrally formed on the substrate by a microelectromechanical system fabrication process (MEMS).

16. The instrumented substrate apparatus of claim 1, wherein the one or more measurement circuits are coupled to at least the photoelectron collector and the photoemissive material, wherein the one or more measurement circuits are configured to measure the one or more electrical signals from the photoelectron collector by a current meter.

17. A method comprising:
providing an instrumented substrate including a plurality of photoelectric sensors disposed on the substrate, one or more of the photoelectric sensors comprising a photoemissive material and a photoelectron collector;
absorbing, with the photoemissive material of the one or more photoelectric sensors, a plurality of photons within a process tool;
emitting, from the photoemissive material of the one or more photoelectric sensors, a plurality of photoelectrons in response to absorbing the plurality of photons;
collecting, with the photoelectron collector of the one or more photoelectric sensors, at least some of the photoelectrons emitted from the photoemissive material;
generating one or more electrical signals in response to collecting the at least some of the photoelectrons;
measuring the one or more electrical signals;
determining wavelength-resolved information of illumination from the process tool based on the one or more electrical signals; and
transporting the instrumented substrate within a front opening unified pod (FOUP).

18. The method of claim 17, wherein the at least some of the photoelectrons emitted from the photoemissive material are collected by a photoelectron collector, wherein the one or more electrical signals are generated in response to collecting the at least some of the photoelectrons by the photoelectron collector.

19. The method of claim 17, wherein the one or more electrical signals include a current; wherein determining the wavelength-resolved information comprises taking a derivative of the current with respect to a voltage of a voltage source, the voltage source electrically coupled with at least the photoelectron collector.

20. The method of claim 17, further comprising: storing the wavelength-resolved information in a memory; and determining a time-resolved information based on the wavelength-resolved information stored in the memory.

21. The method of claim 18, further comprising determining spatially-resolved EUV measurement information.

22. The method of claim 18, wherein the plurality of photons are extreme ultraviolet (EUV) light with an energy from 1 to 100 eV.

23. A method of fabricating an instrumented substrate apparatus configured to determine wavelength-resolved EUV measurement information of a process tool, comprising:
providing a substrate, the substrate including a silicon wafer with a diameter;
forming at least one photoelectric sensor on the substrate by a microelectromechanical system (MEMS) fabrication, the at least one photoelectric sensor including a photoemissive material, a photoelectron collector, and one or more measurement circuits, wherein the instrumented substrate apparatus is fabricated for housing within a front opening unified pod (FOUP).

24. An instrumented substrate apparatus, comprising:
a substrate;
a plurality of photoelectric sensors disposed on the substrate, each photoelectric sensor comprising:
a photoemissive material, the photoemissive material configured to absorb a plurality of EUV photons and emit a plurality of photoelectrons in response absorbing the plurality of EUV photons;
a photoelectron collector, wherein the photoelectron collector is configured to receive at least some of the plurality of photoelectrons and generate one or more electrical signals in response to receiving the at least some of the plurality of photoelectrons, wherein the photoelectron collector is disposed above the photoemissive material and has a ring shape to allow incident EUV photons to pass through the photoelectron collector to the photoemissive material; and
one or more measurement circuits electrically coupled to at least the photoelectron collector and configured to measure the one or more electrical signals from the photoelectron collector.

25. The instrumented substrate apparatus of claim 24, wherein the photoemissive material and the photoelectron collector have a difference in electric potential.

26. The instrumented substrate apparatus of claim 25, wherein the photoemissive material is configured to emit the plurality of photoelectrons in response to absorbing the photons when an energy of the plurality of photons absorbed by the photoemissive material exceeds a work function of the photoemissive material plus a stopping voltage.

27. The instrumented substrate apparatus of claim 24, further comprising:
a controller disposed on the substrate, the controller configured to receive measurement information from the one or more measurement circuits, wherein the controller includes one or more processors configured to execute a set of program instructions stored in memory.

28. The instrumented substrate apparatus of claim 27, wherein the one or more processors are configured to determine wavelength-resolved extreme ultraviolet (EUV) measurement information associated with the plurality of photons based on the one or more electrical signals from the one or more measurement circuits.

29. The instrumented substrate apparatus of claim 28, wherein the one or more processors are configured to determine the wavelength-resolved EUV measurement information based on a derivative of current with respect to voltage.

30. The instrumented substrate apparatus of claim 28, wherein the one or more processors are configured to determine spatially-resolved EUV measurement information based on the wavelength-resolved EUV measurement information from the plurality of photoelectric sensors.

31. The instrumented substrate apparatus of claim 28, wherein the one or more processors are configured to store the wavelength-resolved EUV measurement information in a memory of the controller.

32. The instrumented substrate apparatus of claim 27, wherein the one or more processors are configured to determine a time-resolved EUV measurement information based on the wavelength-resolved EUV measurement information stored in the memory.

33. The instrumented substrate apparatus of claim 24, wherein the photoemissive material comprises at least one of gold, platinum, ruthenium, palladium, titanium, tantalum, tungsten, molybdenum, cobalt, zinc, tin, or gallium.

34. The instrumented substrate apparatus of claim 24, wherein the photoemissive material and the photoelectron are integrally formed on the substrate by a microelectromechanical system fabrication process (MEMS).

35. A photoelectric sensor comprising:
a photoemissive material disposed on a substrate, the photoemissive material configured to absorb a plurality of EUV photons and emit a plurality of photoelectrons in response to absorbing the plurality of EUV photons;
a photoelectron collector, wherein the photoelectron collector is configured to receive at least some of the plurality of photoelectrons and generate one or more electrical signals in response to receiving the at least some of the plurality of photoelectrons, wherein the photoelectron collector is disposed above the photoemissive material and has a ring shape to allow incident EUV photons to pass through the photoelectron collector to the photoemissive material; and
one or more measurement circuits electrically coupled to at least the photoelectron collector and configured to measure the one or more electrical signals from the photoelectron collector.

* * * * *